United States Patent [19]
Wray

[11] Patent Number: 4,817,865
[45] Date of Patent: Apr. 4, 1989

[54] VENTILATION SYSTEM FOR MODULAR ELECTRONIC HOUSING

[75] Inventor: Donald L. Wray, Lauderdale, Fla.

[73] Assignee: Racal Data Communications Inc., Sunrise, Fla.

[21] Appl. No.: 169,551

[22] Filed: Mar. 17, 1988

[51] Int. Cl.$^4$ ................................................ F24F 7/00
[52] U.S. Cl. ..................................... 236/49.5; 165/22; 361/384
[58] Field of Search ...................... 236/49 D, DIG. 9; 165/22; 361/384, 382, 379

[56] References Cited

U.S. PATENT DOCUMENTS

| | | | |
|---|---|---|---|
| 2,038,578 | 4/1936 | Lamb | 236/DIG. 9 |
| 3,844,475 | 10/1974 | Kesterson et al. | 165/26 X |
| 4,009,825 | 3/1977 | Coon | 236/1 E |
| 4,126,269 | 11/1978 | Bruges | 236/49 |
| 4,182,484 | 1/1980 | Stanke et al. | 236/1 C |
| 4,244,517 | 1/1981 | Stanke et al. | 236/49 |
| 4,406,397 | 9/1983 | Kamata et al. | 236/1 B |
| 4,422,571 | 12/1983 | Bowman | 236/49 |
| 4,523,715 | 6/1985 | Ohsawa et al. | 236/49 |
| 4,533,080 | 8/1985 | Clark et al. | 236/49 D |
| 4,607,789 | 8/1986 | Bowman | 236/49 |
| 4,702,154 | 10/1987 | Dodson | 98/1 |
| 4,722,669 | 2/1988 | Kundert | 236/DIG. 9 |

OTHER PUBLICATIONS

Linear Integrated Circuits, Types LM193, LM293, LM393, LM293A, LM393A, LM2903, Dual Differential Comparators, 4–29 through 4–31, Texas Instruments Linear Circuits Data Book.
Linear Integrated Circuits, Type LM3302, Quadruple Differential Comparator, 4–35 through 4–38, Texas Instruments Linear Circuits Data Book.
Linear Integrated Circuits, Types LM111, LM211, LM311, Differential Comparators with Strobes, 4–15 through 4–24, Texas Instruments Linear Circuits Data Book.
CMP-04 Quad Low-Power Precision Comparator, 8–22 through 8–29, Precision Monolithics, 1986 Linear Data Book.
Linear Integrated Circuit, Types LM139, LM239, LM339, LM139A, LM239A, LM339A, LM2901, Quadruple Differential Comparators, 4–25, Texas Instruments 1984 Linear Circuits Data Book.

Primary Examiner—William E. Wayner
Attorney, Agent, or Firm—Jerry A. Miller

[57] ABSTRACT

A ventilation arrangement for a modular enclosure for electronic circuits includes a ventilation fan (8) including a motor (10) for providing movement of cooling air in the modular enclosure, the motor (10) being operable at at least two speeds including a lower speed and a higher speed wherein the higher speed induces greater air movement than the lower speed. A plurality of modular compartments (1, 2, 3, 4, 5) house a corresponding plurality of electronic circuits, with each of the modular compartments including an air path for the cooling air moved by the ventilation fan (8). A plurality of temperature sensors (32, 34, 36, 38, 40), one situated in each of the modular compartments (1, 2, 3, 4, 5), individually sense the temperature in each of the compartments. A speed control circuit (66), responsive to each of the temperature sensors causes the motor (10) to operate at the lower speed if the temperature in each of the modular compartments is below a predetermined threshold and causes the motor (10) to operate at the higher speed if the temperature in any one or more of the modular compartments exceeds the predetermined threshold. In this manner, if any of the modular compartments requires additional ventilation, the speed of operation of the motor (10) is increased to provide the required additional ventilation.

10 Claims, 1 Drawing Sheet

VENTILATION SYSTEM FOR MODULAR ELECTRONIC HOUSING

BACKGROUND OF THE INVENTION

1. Field of the Invention

This invention relates generally to the field of modular housing systems for electronic components. More particularly, this invention relates to a ventilation system for such modular electronic housings which assures proper cooling of all modules.

2. Background

Fans and blowers have been used to cool electronic systems for many years. For example, the IBM ® personal computer series uses such a ventilating fan which operates at a more or less constant speed to provide a cooling air flow to the circuitry within the housing. In more sophisticated applications, it is known to measure the temperature of the air within the housing and use an analog control which varies the fan speed in accordance with the amount of cooling air flow required in a continuously variable manner so that when more air flow is needed the fan motor is speeded up.

One problem associated with such cooling fans in many environments is that the fans produce a great deal of noise. The can be annoying to workers who must work in the presence of these fans for long periods of time. The continuously variable fan speed provides a partial solution to this problem in that as long as the temperature within the housing is exceptable on the average, the speed can be kept at a minimum.

Unfortunately, providing a continuously variable fan speed for a modular housing arrangement for electronic circuits such as that shown in U.S. patent application Ser. No. 042,186 to Buron et al. filed Apr. 24, 1987, which is incorporated by reference herein, can be difficult to accurately implement. Such a system, by necessity, relies upon an averaging of the temperature of the air flow to make a determination about the appropriate fan speed. Since it is possible for one of the modules to operate at a substantially higher temperature than the remainder of the modules, depending upon an average air temperature might lead to inaccurate control of the temperature resulting in premature failure of one or more modules which are operating too hot.

The present invention addresses this problem by providing a unique fan speed control mechanism as will be described hereafter.

SUMMARY OF THE INVENTION

It is an object of the present invention to provide an improved fan speed control for a modular electronic housing.

It is another object of the present invention to provide a fan speed control for an electronic housing which provides increased air flow when needed for any one of a plurality of modules.

It is another object of the present invention to provide a fan speed control mechanism which keeps fan noise at a minimum unless a particular module in a modular electronic housing requires more cooling air flow.

It is a further object of the present invention to provide a fan speed control for a modular electronic device which utilizes an electrical bus for interconnection of the various modules and which uses a minimal number of bus lines.

These and other objects and advantages of the invention will become apparent to those skilled in the art upon consideration of the following description.

In one embodiment of the present invention, an improved ventilation arrangement for a modular enclosure for electronic circuits includes a ventilation fan (8) including a motor (10) for providing movement of cooling air in the modular enclosure, the motor (10) being operable at at least two speeds including a lower speed and a higher speed wherein the higher speed induces greater air movement than the lower speed. A plurality of modular compartments (1, 2, 3, 4, 5) house a corresponding plurality of electronic circuits, with each of the modular compartments including an air path for the cooling air moved by the ventilation fan (8) A plurality of temperature sensors (32, 34, 36, 38, 40), one situated in each of the modular compartments (1, 2, 3, 4, 5), individually sense the temperature in each of the compartments. A speed control circuit (66), responsive to each of the temperature sensors causes the motor (10) to operate at the lower speed if the temperature in each of the modular compartments is below a predetermined threshold and causes the motor (10) to operate at the higher speed if the temperature in any one or more of the modular compartments exceeds the predetermined threshold. In this manner, if any of the modular compartments requires additional ventilation, the speed of operation of the motor (10) is increased to provide the required additional ventilation.

In a method according to the present invention, of controlling the speed of a ventilation fan motor used to cool a modular electronic housing, the modular electronic housing having a plurality of modular compartments, the method comprises the steps of sensing a temperature in each of the plurality of modular compartments; comparing each of the sensed temperatures with a temperature threshold; and increasing an operating speed of a ventilation fan in the event one or more of the sensed temperatures exceeds the predetermined thresholds.

The features of the invention believed to be novel are set forth with particularity in the appended claims. The invention itself, however, both as to organization and method of operation, together with further objects and advantages thereof, may be best understood by reference to the following description taken in conjunction with the accompanying drawings.

DETAILED DESCRIPTION OF THE INVENTION

Figure 1:
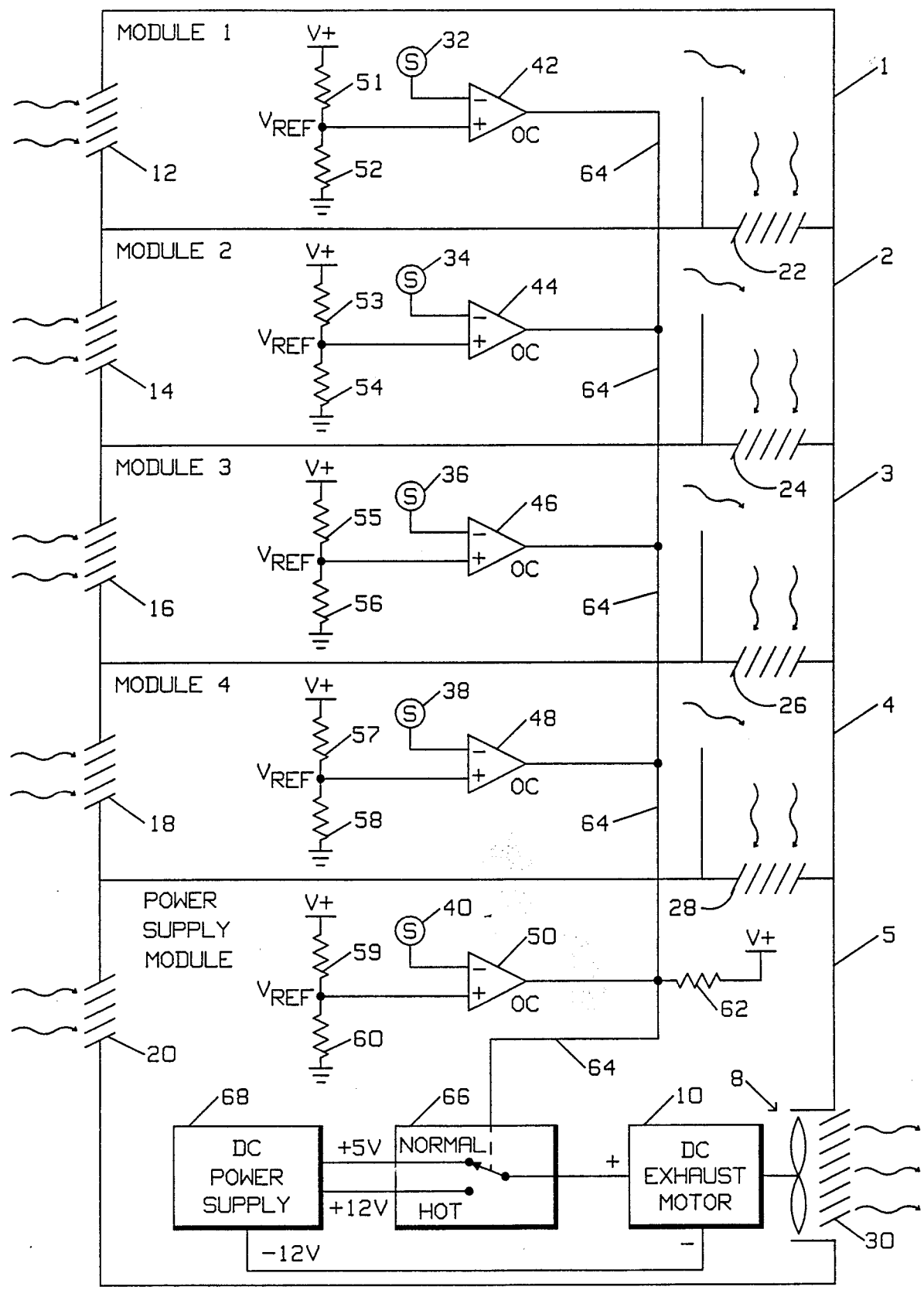
FIG. 1 shows a schematic diagram of the ventilation system of the present invention.

Turning now to FIG. 1, a modular housing arrangement is depicted schematically as having a total of five modules shown as modules 1, 2, 3, 4 and a power supply module 5. Each of these five modules is a distinct enclosure and all are mechanically attached together to utilize the services of a common exhaust fan 8 having a DC exhaust fan motor 10. In the preferred embodiment, a commercially available fan such as the model RL80-18/24 D.C. fan and motor available from Pamotor ™ corporation is suitable. Numerous other suitable fan motors are appropriate and available commercially. Cooling air enters through vents provided in each of the modules. Module 1 uses intake vent 12 while module 2 uses intake vent 14, module 3 uses intake vent 16, module 4 uses intake vent 18 and module 5 uses intake vent 20.

Each module is also provided with an exhaust vent which passes the warmed ventilating air ultimately to the power supply module 5 to be exhausted by exhaust fan 8. Module 1 uses exhaust vent 22 while module 2 uses exhaust vent 24. Module 3 uses exhaust vent 26 and module 4 uses exhaust vent 28. In one embodiment of the present invention the exhaust vents lead to a chamber which ultimately diverts the exhaust air to the power supply module 5 thus isolating the warmed air from modules closer to the exhaust fan. This is not to be limiting however as the exhaust vents may lead directly to the chamber housing the exhaust fan 8 or other arrangements. In the preferred embodiment the exhaust fan is housed in the power supply module 5 but this is not to be limiting since the exhaust fan could equally well be placed in any of the other modules without departing from the present invention. the power supply module 5 uses exhaust vent 30 which serves as the exhaust vent for the entire housing assembly by virtue of the power supply module receiving the flow of heated air from each of the other modules for disposal by the exhaust fan. In this arrangement the exhaust fan blows air out of vent 30 thereby aspirating cooling air through vents 12, 14, 16, 18 and 20 to provide a cooling air flow for the system.

Since each of the modules may operate at a different temperature, a temperature sensor is provided in each of the modules. In some modules, however, which operate a very low power, in may be found that no sensor at all is required and may therefore be omitted. The temperature sensor for module 1 is temperature sensor 32, the temperature sensor for module 2 is sensor 34. The temperature sensor for module 3 is 36 and the temperature sensor for module 4 is temperature sensor 38. A temperature sensor is also preferably used in the power supply module and is labeled temperature sensor 40 in FIG. 1. The temperature sensor used may be for example the National Semiconductor ® model LM34 or similar. This device provides an approximately linear change in output voltage of about 10 millivolts per degree fahrenheit at its output terminal. Of course, other types of temperature sensitive devices such as diodes, transistors, thermistors, etc. could be used to sense the compartment temperature. The sensor's output voltage is compared using a plurality of comparators 42, 44, 46, 48 and 50 in each of modules 1-5 with a reference voltage established within each of the modules using a voltage divider circuit. As shown in the drawings, each of the modules includes a voltage divider circuit with module 1 having a voltage divider circuit made up of resistors 51 and 52 connected in series between a positive supply voltage and ground with the reference voltage taken at the junction of the two resistors. Module 2 includes a similar voltage divider made up of resistors 53 and 54 while module 3 includes includes a similar voltage divider made up of resistors 55 and 56. Module 4 includes a voltage divider circuit made up of resistors 57 and 58 while module 5 includes a voltage divider made up resistors 59 and 60. The reference voltage from each of these voltage dividers is connected to the non-inverting terminal of the comparator within each of the respective modules.

In the preferred embodiment, the voltage divider circuits are set to provide a reference voltage ($V_{ref}$) of about 1.22 volta DC. This corresponds approximately to a temperature within the module of about 50° C. This is not to be limiting, however, since in other embodiments, higher or lower temperature thresholds may be more suitable. In some applications, it may be desirable to allow certain modules to operate at higher temperatures than others so that different modules may use different voltage divider circuits.

Comparators 42, 44, 46, 48 and 50 may include a small amount of hysteresis to prevent chattering at the comparator output. Each of the comparator outputs are open collector outputs so that each of the outputs may be tied together along a single bus line interconnecting the plurality of modules. This allows the comparators to operate in a manner similar to an OR gate, in that if any one of the comparitor outputs go low, the bus lines goes low. Within the power supply module 5 is a pull up resistors 62 which provides a common source of output current for all of the open collector comparators 42-50. The comparator outputs are normally near supply voltage V+, but if any of the temperatures exceed the threshold set by the $V_{ref}$, the output of its associated comparator will pull the voltage at line 64 to near ground potential. Line 64 is used to control a switch 66 which is connected to a power supply 68 and the DC exhaust fan motor 10 so that when the voltage at line 64 is high, the switch applies the 5 volt output from power supply 68 to the DC exhaust motor and operates the exhaust motor at a low speed. The exhaust fan receives −12 volts at its negative terminal so that at low speed it is operating on a total of 17 volts DC. If any one or more of the comparators pulls line 64 low switch 66 switches to provide a 12 volt output from power supply 68 to the DC exhaust fan motor 10 thus increasing the voltage across the motor to 24 volts DC and thereby increasing the exhaust motor speed and providing greater air flow through the modules. In this manner when any of the various modules individually exceed a temperature set by the established reference threshold, the speed of the fan increases to provide additional ventilation and cooling for all of the modules including the effected module. This provides a very inexpensive and effective mechanism for assuring that all modules are maintained at a safe operating temperature.

While FIG. 1 shows that the comparators are all contained within each of the individual modules, many variations will occur to those skilled in the art. For example, all of the comparators may be readily provided within a single power supply module thus further economizing the circuitry by allowing use of multiple comparator integrator circuits. Similarly a single voltage reference can be provided for each of the comparators. Of course this modification requires additional interconnection of the various modules to provide the additional bus lines. In addition, other variations will occur to those skilled in the art by recognizing that the circuitry basically performs an OR function. That is, when module 1 OR module 2 OR module 3 OR module 4 OR module 5 is overheating, the speed of the exhaust fan motor is increased Numerous circuit implementations are possible within the scope of the present invention. Of course, the present example embodiment using five modules, is only intended to be illustrative of the concept which is in no way limited to housings having five modules.

Thus it is apparent that in accordance with the present invention, a method that fully satisfies the aims, advantages and objectives is set forth above. While the invention has been described in conjunction with with specific embodiments, it is evident that many alternatives, modifications and variations will become apparent to those skilled in the art upon consideration of the forgoing description. Accordingly, it is intended that the present invention embrace all such alternatives, modifications and variations as fall within the spirit and broad scope of the appended claims.

What is claimed is:

1. A ventilation arrangement for a modular enclosure for electronic circuits, comprising in combination:

a ventilation fan includng a motor for providing movement of cooing air in said modular enclosure, said motor being operable at at least two speeds including a lower speed and a higher speed wherein said higher speed induces greater air movement than said lower speed;

a plurality of modular electronic circuit compartments for housing a corresponding plurality of electronic circuits, each of said modular compartments including an air path for said cooling air moved by said ventilation fan;

a plurality of temperature sensing means, one situated in each of said modular compartments, for individually sensing the temperature in each of said compartments as an indication of the temperature of each of said electronic circuits; and speed control means, responsive to each of said temperature sensing means, for causing said motor to operate at said lower speed if the temperature in each of said modular compartments is below a predetermined threshold and for causing said motor to operate at said higher speed if the temperature in any one or more of said modular compartments exceeds said predetermined threshold;

whereby, if any one or more of said electronic circuits within said modular compartments require additional ventilation, the speed of operation of said motor is increased to provide the required additional ventilation in all of said compartments.

2. The apparatus of claim 1, wherein said sensing means includes means for converting a temperature to a D. C. voltage.

3. The apparatus of claim 2, wherein said sensing means further includes comparing means for comparing said D. C. voltage to a reference voltage in order to determine whether or not the temperature has exceed said predetermined threshold.

4. The apparatus of claim 3, wherein said comparing means includes a plurality of open collector output comparitors, each of which have their outputs tied together to a common node.

5. The apparatus of claim 1, further comprising a source of a plurality of D. C. voltages and switching means for switching said plurality of D. C. voltages to said motor in order to establish said higher and said lower speeds.

6. A ventilation arrangement for a modular enclosure for electronic circuits, comprising in combination:

a ventilation fan including a motor for providing movement of cooing air in said modular enclosure, said motor being operable at at least two speeds including a lower speed and a higher speed wherein said higher speed induces greater air movement than said lower speed;

a plurality of modular electronic circuit compartments for housing a corresponding plurality of electronic circuits, each of said modular compartments including an air path for said cooling air moved by said ventilation fan;

a plurality of temperature sensing means, one situated in each of said modular compartments, for individually sensing the temperature in each of said compartments as an indication of the temperature of each of said electronic circuits, said sensing means including means for converting a temperature to a D. C. voltage;

comparing means for comparing said D. C. voltage to a reference voltage in order to determine whether or not the temperature has exceed said predetermined threshold, said comparing means including a plurality of open collector output comparitors, each of which have their outputs tied together to a common node;

a source of a plurality of D. C. voltages;

speed control means, responsive to said comparing means, for causing said motor to operate at said lower speed if the temperature in each of said modular compartments is below a predetermined threshold, and for causing said motor to operate at said higher speed if the temperature in any one or more of said electronic circuits within said modular compartments exceeds said predetermined threshold so that increased air movement is provided, said speed control means including switching means for switching said plurality of D. C. voltages to said motor in order to cause said motor to operate at said higher and said lower speeds.

7. A method of controlling the speed of a ventilation fan motor used to cool electronic circuits within a modular electronic housing, said modular electronic housing having a plurality of modular electronic circuit compartments, comprising the steps of:

sensing a temperature in each of said plurality of modular compartments as an indication of the temperature of each of said electric circuits;

comparing each of said sensed temperatures with a temperature threshold; and increasing an operating speed of a ventilation fan so that cooling air flow is increased in each of said plurality of compartments in the event one or more of said sensed temperatures exceeds said predetermined thresholds.

8. The method of claim 7, wherein said sensing step is carried out by converting said sensed temperature to a signal level and said comparing step is carried out by comparing said signal level with a reference signal level.

9. The method of claim 7, wherein said increasing step is carried out by increasing a voltage to a motor driving said ventilation fan.

10. The method of claim 7, wherein said comparing step includes driving a single signal line by a plurality of open collector output comparitors.

* * * * *